United States Patent
Guzman et al.

(10) Patent No.: US 7,304,527 B1
(45) Date of Patent: Dec. 4, 2007

(54) FUSE SENSING CIRCUIT

(75) Inventors: Mario E. Guzman, San Jose, CA (US);
Wanli Chang, Saratoga, CA (US);
Christopher F. Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 42 days.

(21) Appl. No.: 11/292,039

(22) Filed: Nov. 30, 2005

(51) Int. Cl.
*H03K 17/18* (2006.01)
*H01H 85/30* (2006.01)

(52) U.S. Cl. .................................. 327/525; 365/225.7
(58) Field of Classification Search ............... None
See application file for complete search history.

(56) References Cited

U.S. PATENT DOCUMENTS

| | | | |
|---|---|---|---|
| 6,384,664 B1* | 5/2002 | Hellums et al. | 327/525 |
| 6,567,333 B2* | 5/2003 | Toda | 365/225.7 |
| 6,819,144 B2* | 11/2004 | Li et al. | 327/55 |
| 6,919,754 B2* | 7/2005 | Kuroki | 327/525 |
| 7,019,534 B2* | 3/2006 | Wu | 324/550 |
| 2005/0195016 A1* | 9/2005 | Wu | 327/525 |

* cited by examiner

*Primary Examiner*—Kenneth B. Wells
*Assistant Examiner*—Terry L. Englund
(74) *Attorney, Agent, or Firm*—Morgan, Lewis & Bockius LLP

(57) ABSTRACT

A sensing circuit senses the programmed state of fuses such as polysilicon (poly) fuses. In a preferred embodiment, the sensing circuit comprises first and second amplifier stages, a fuse and a reference resistor wherein the fuse and the reference resistor are connected, respectively, to first and second inputs of the first amplifier stage. The first and second amplifier stages are differential amplifiers and the output of the second amplifier stage is buffered. Circuitry for programming the fuse is part of the sensing circuit.

11 Claims, 2 Drawing Sheets

FUSE SENSING CIRCUIT

FIELD OF THE INVENTION

This relates to a sensing circuit for sensing a programmed state of fuses such as polysilicon fuses.

BACKGROUND OF THE INVENTION

Fuses are widely used in semiconductor integrated circuits in both analog and digital circuits. Early fuses were metal based and were programmed by destroying the fuse with a laser beam. More recently, fuses have been developed that are electrically programmable using electromigration. See, for example, C. Kothandaraman et al., "Electrically Programmable Fuse (eFuse) Using Electromigration in Silicides," IEEE Electron Device Letters, Vol. 23, No. 9, pp. 523-525 (September 2002). Typically, the state of the fuse—unprogrammed (or intact) or programmed (or blown)—is read out by determining the voltage drop across the fuse using a voltage divider network or its equivalent. It has been difficult, however, to use electrically programmable fuses in modern integrated circuits because the fuses use a bias voltage that requires them to be relatively large in size and they have a narrow window of sensitivity that does not work well across process, voltage and temperature variations.

SUMMARY OF THE INVENTION

The present invention is a sensing circuit for sensing the programmed state of fuses. In one embodiment, the sensing circuit comprises at least a first differential amplifier, a fuse and a reference resistor wherein the fuse and the reference resistor are connected at first and second inputs, respectively, of the differential amplifier. The resistance of the reference resistor is chosen to be between the resistance of the fuse in its unprogrammed state and the resistance of the fuse in its programmed state. As a result, when the fuse and the reference resistor are connected to a voltage supply, there is a voltage difference at the first and second inputs of the differential amplifier that is amplified by the amplifier and used to generate an output indicative of the state of the fuse.

In a preferred embodiment, the sensing circuit comprises first and second amplifier stages, a fuse and a reference resistor wherein the fuse and the reference resistor are connected, respectively, to first and second inputs of the first amplifier stage. Advantageously, the first and second amplifier stages are differential amplifiers and the output of the second amplifier stage is a buffered, single-ended signal indicative of the state of the fuse. Circuitry for programming the fuse is advantageously part of the sensing circuit as well.

The invention may be practiced with any type of fuse including those that are laser programmable such as metal fuses and those that are electrically programmable such as polysilicon (poly) fuses.

BRIEF DESCRIPTION OF THE DRAWINGS

These and other objects, features and advantages of the present invention will be more readily apparent from the following Detailed Description in which.

DETAILED DESCRIPTION

Figure 1:
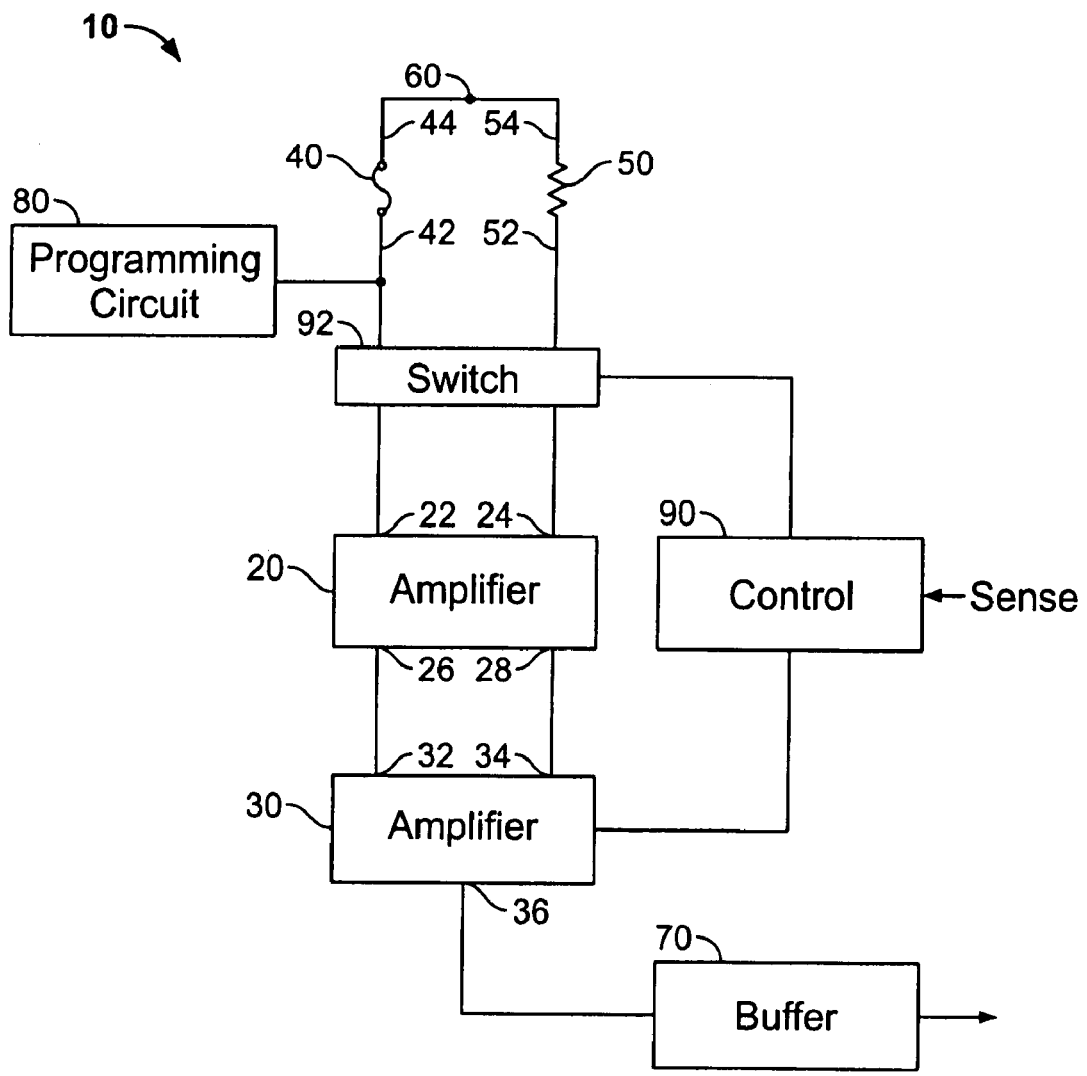
FIG. 1 is a block diagram of an illustrative embodiment of the invention.

FIG. 1 is block diagram of an illustrative sensing circuit 10 of the present invention. Circuit 10 comprises a first amplifier 20, second amplifier 30, a fuse 40, a reference resistor 50 and an output buffer 70. Circuit 10 further comprises a programming circuit 80 for programming fuse 40 and a control circuit 90 for enabling amplifiers 20 and 30. Illustratively, control circuit 90 enables amplifier 20 via switch 92.

Amplifier 20 has first and second inputs 22, 24 and first and second outputs 26, 28; and amplifier 30 has first and second inputs 32, 34 and at least a first output 36. The first and second outputs 26, 28 of amplifier 20 are connected to the first and second inputs of amplifier 30. A first terminal 42 of fuse 40 is connected via switch 92 to the first input of amplifier 20 and a first terminal 52 of reference resistor 50 is connected via switch 92 to the second input of amplifier 20. A second terminal 44 of fuse 40 and a second terminal 54 of reference resistor 50 are connected together at a first node 60. In a functioning circuit, node 60 is connected to a power supply. In a preferred embodiment, the resistance of resistor 50 is chosen so that it is approximately midway between the resistance of fuse 40 in its unprogrammed state and the resistance of fuse 40 in its programmed state; but the invention is operable over a wide range of resistance values as long as the resistance of the reference resistor is between the resistance of fuse 40 in its unprogrammed state and the resistance of fuse 40 in its programmed state.

Circuit 10 operates as follows. Fuse 40 may be programmed (or blown) by passing a large electrical current through it. This is done by turning on programming circuit 80 in response to an input signal. In the case where fuse 40 is a polysilicon (or poly) fuse, the resistance of the fuse in its unprogrammed state is typically in the range of 100 to 200 Ohms. In its programmed state the resistance of the fuse is typically in the range of 2,000 to 10,000 Ohms. For these resistance values for fuse 40, a typical resistance value for resistor 50 is 900 Ohms.

The state of fuse 40 is read by applying a sensing signal to control circuit 90. Upon receiving such a signal, control circuit closes switch 92 and thereby connects the first terminals of fuse 40 and resistor 50 to the first and second inputs 22, 24 of amplifier 20. The control circuit also activates amplifier 30. In the case where fuse 40 is unprogrammed, its resistance is less than that of reference resistor 50. Conversely, in the case where fuse 40 is programmed, its resistance is more than that of reference resistor 50. As a result, the difference between the signals applied to inputs 22, 24 of amplifier 20 has one polarity when fuse 40 is unprogrammed and the opposite polarity when fuse 40 is programmed. This difference is amplified by amplifier 20 and provided via outputs 26, 28 to inputs 32, 34 of amplifier 30. Amplifier 30 further amplifies this difference and produces a single-ended output signal on output 36 to buffer 70. As detailed below, in the specific implementation of FIG. 1 that is shown in FIG. 2, the voltage at input 22 of amplifier 20 is higher than that at input 24 when the fuse is unprogrammed and lower than that at input 24 when the fuse is programmed.

Figure 2:
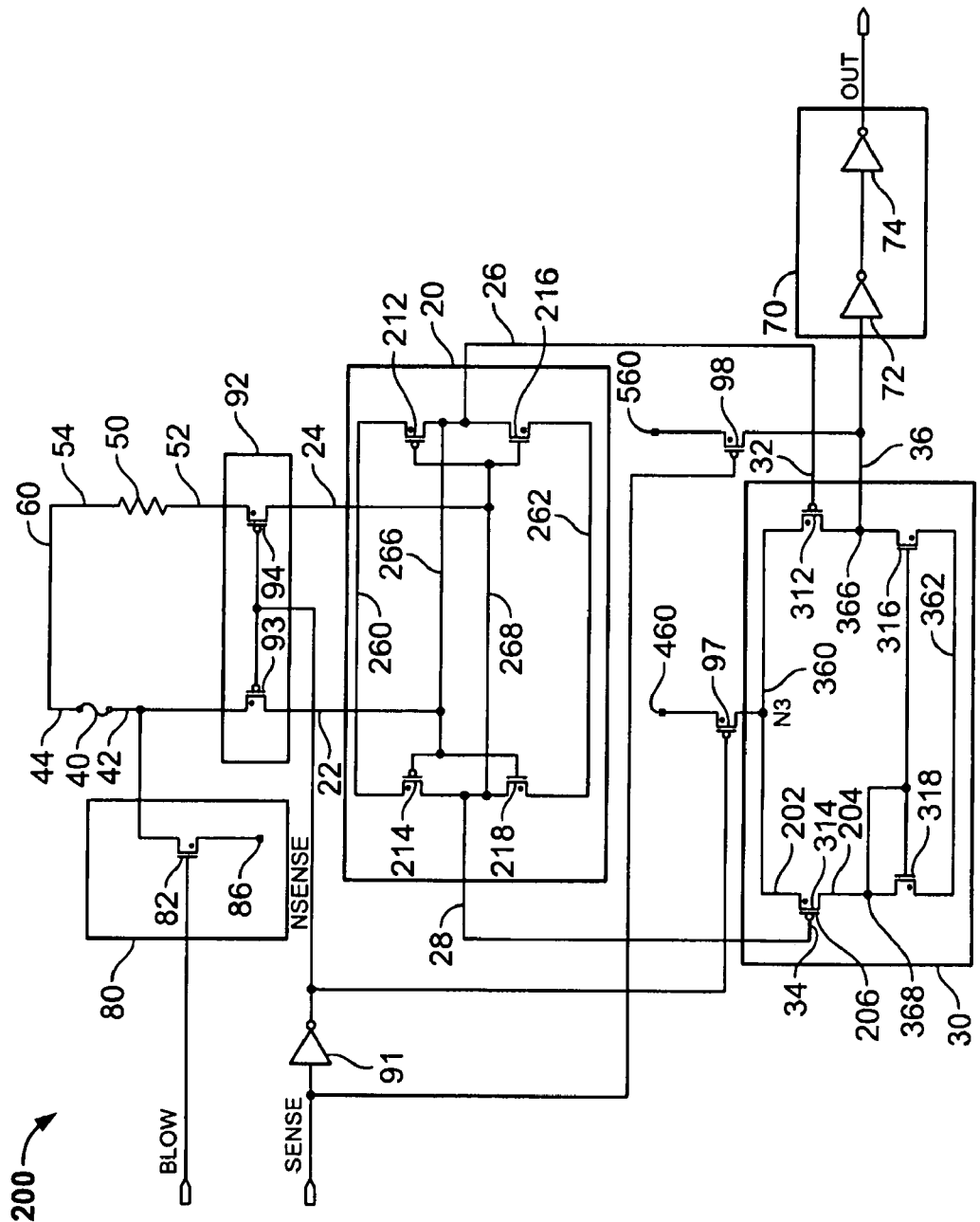
FIG. 2 is a schematic diagram of an illustrative embodiment of the invention.

FIG. 2 is a schematic diagram of a circuit 200 that implements the block diagram of FIG. 1. In FIG. 2 the elements that correspond to elements of FIG. 1 are identified by the same number. As will be apparent, circuit 200 comprises several MOS transistors, each of which includes a source 202, a drain 204 and a gate 206. Following convention, the source terminal is designated by a dot.

Amplifier 20 comprises first and second PMOS transistors 212, 214 and first and second NMOS transistors 216, 218. The first PMOS transistor and the first NMOS transistor are connected in series between a second node 260 and a third node 262; and the second PMOS transistor and the second NMOS transistor are likewise connected in series between the second node 260 and the third node 262. As shown in FIG. 2, the sources of the PMOS transistors 212, 214 are connected to the second node 260, the sources of the NMOS transistors 216, 218 are connected to third node 262, the drains of PMOS transistor 212 and NMOS transistor 216 are connected together at a fourth node 266 and the drains of PMOS transistor 214 and NMOS transistor 218 are connected together at a fifth node 268. Node 260 is connected to a power supply, typically Vcc, and node 262 is connected to ground. Input 24 is connected to the gates of PMOS transistor 212 and NMOS transistor 216 and to node 268. Input 22 is connected to the gates of PMOS transistor 214 and NMOS transistor 218 and to node 266. Thus, the first series-connected PMOS and NMOS transistors function as an inverter and the second series-connected PMOS and NMOS transistors likewise function as an inverter. Outputs 26, 28 of amplifier 20 are connected to nodes 266 and 268.

Amplifier 30 comprises first and second PMOS transistors 312, 314 and first and second NMOS transistors 316, 318. The first PMOS transistor and the first NMOS transistor are connected in series between a sixth node 360 and a seventh node 362; and the second PMOS transistor and the second NMOS transistor are likewise connected in series between the sixth node 360 and the seventh node 362. As shown in FIG. 2, the sources of the PMOS transistors 312, 314 are connected to the sixth node 360, the sources of the NMOS transistors 316, 318 are connected to seventh node 362, the drains of PMOS transistor 312 and NMOS transistor 316 are connected together at an eighth node 366 and the drains of PMOS transistor 314 and NMOS transistor 318 are connected together at a ninth node 368. Input 32 is connected to the gate of PMOS transistor 312 and input 34 is connected to the gate of PMOS transistor 314. In addition, ninth node 368 is connected to the gates of NMOS transistors 316, 318, thereby forming a current mirror. Output 36 of amplifier 30 is connected to node 366.

Output buffer 70 comprises first and second inverters 72, 74 connected in series to the eighth node 366.

Programming circuit 80 comprises an NMOS transistor 82 having a drain connected to first terminal 42 of fuse 40 and a source connected to a tenth node 86 that is connected to ground. The programming circuit is controlled by a programming signal BLOW applied to the gate of transistor 82.

Control circuit 90 comprises an inverter 91, first and second PMOS transistors 93, 94 that constitute switch 92 and third and fourth PMOS transistor 97, 98 that control amplifier 30. The source of PMOS transistor 93 is connected to first terminal 42 of fuse 40 and the drain of transistor 93 is connected to first input 22 of amplifier 20. The source of PMOS transistor 94 is connected to first terminal 52 of reference resistor 50 and the drain of transistor 94 is connected to second input 24 of amplifier 20. The source of PMOS transistor 97 is connected to an eleventh node 460 and the drain of transistor 97 is connected to the sixth node 360. The source of PMOS transistor 98 is connected to a twelfth node 560 and the drain of transistor 98 is connected to the eighth node 366. Control circuit 90 is controlled by a SENSE signal applied to inverter 91 and transistor 98; and an inverted SENSE signal, NSENSE, is applied to the gates of transistors 93, 94 and 97.

Preferably, eleventh node 460 and twelfth node 560 are connected together and in a functioning circuit are connected to the power supply, Vcc. As a result, when the state of fuse 40 is not being sensed, the SENSE signal is low, thereby turning on transistor 98. This connects the power supply voltage to the input of buffer inverter 72, in effect turning off the rest of the sensing circuit. When the state of fuse 40 is being sensed, the SENSE signal is high, thereby turning off PMOS transistor 98 and allowing the input to buffer inverter 72 to be controlled by the output 36 of amplifier 30. At the same time, the inverted sense signal NSENSE is low, thereby turning on PMOS transistors 93, 94 and 97. When PMOS transistor 97 is turned on, the power supply voltage is connected to node 360.

To read the state of fuse 40 with the circuit of FIG. 2, a SENSE signal is applied to control circuit 90. The SENSE signal turns off PMOS transistor 98 thereby allowing the input to buffer inverter 72 to be controlled by the output 36 of amplifier 30. The SENSE signal is also inverted by inverter 91 to produce a low signal that turns on PMOS transistors 93, 94 and 97.

Transistors 93, 94 connect the first terminals of fuse 40 and resistor 50 to the first and second inputs 22, 24 of amplifier 20. As noted above, in the case where fuse 40 is unprogrammed, its resistance is less than that of reference resistor 50; and when fuse 40 is programmed, its resistance is more than that of reference resistor 50. As a result, the difference between the signals applied to inputs 22, 24 of amplifier 20 has one polarity when fuse 40 is unprogrammed and the opposite polarity when fuse 40 is programmed. In particular, the voltage at input 22 of amplifier 20 is higher than that at input 24 when the fuse is unprogrammed and lower than that at input 24 when the fuse is programmed. This voltage difference is amplified by amplifier 20 and provided to output terminals 26, 28. In particular, the voltage at output 26 of amplifier 20 is higher than that at output 28 when the fuse is unprogrammed and lower than that at output 28 when the fuse is programmed; and the voltage difference at output terminals 26, 28 is greater than that at input terminals 22, 24.

The voltage signals at output terminals 26, 28 are applied to input terminals 32, 34 of amplifier 30 which are connected to the gates of PMOS transistors 312, 314, respectively. The sources of PMOS transistors 312, 314 are connected to the power supply, Vcc, by PMOS transistor 97 that was turned on by the NSENSE signal. The voltage difference between the signals applied to input terminals 32, 34 is further amplified by amplifier 30 and used to produce an output signal at output 36 that either is close in value to that of the power supply, Vcc, or is close to ground. In particular, when the voltage signal at input 32 is higher than that at input 34 as is the case when the fuse is unprogrammed, PMOS transistor 314 is made more conductive than PMOS transistor 312. As a result, node 368 becomes more positive than node 366 and since node 368 is connected to the gates of NMOS transistors 316, 318, these transistors become partially conductive, thereby lowering the voltage at node 366 and output 36 to a value close to ground. Conversely, when the voltage signal at input 32 is lower than that at input 34 as is the case when the fuse is programmed, PMOS transistor 312 is made more conductive than PMOS transistor 314. As a result, the voltage at node 366 and output 36 approaches the magnitude of the voltage supply Vcc. At the same time, PMOS transistor 314 remains substantially off and in the absence of any current flow in transistor 314, transistors 316 and 318 also remain off.

Thus, when the fuse is unprogrammed, the signal at output 36 of amplifier 30 is low; and when the fuse is programmed, the signal is high.

The invention may be practiced in numerous variations. While the preferred embodiment of the invention has been described as having two stages of amplification, the invention may also be practiced having more than two stages of amplification or even just a single stage. The preferred embodiment of the invention has been described with a pair of output buffers that isolate the sensing circuit and facilitate connection to other circuits. In other applications, the invention may be practiced without such buffers.

Advantageously, the circuit of the present invention includes circuitry for programming the fuse but other means can be used for such programming. Where the programming circuitry is included and the fuse is polysilicon, transistor 82 must be large enough to sink the current needed to cause the electro-migration effect in the polysilicon and program the fuse. One advantage of the present invention is that the size of transistor 82 can readily be adjusted to compensate for changes in properties of the fuse. In practice, transistor 82 may be about two orders of magnitude larger than that of the transistors in amplifiers 20, 30.

As indicated above, the resistance of the reference resistor must be between the resistance of the fuse in its unprogrammed state and its resistance in its programmed state. Preferably, the resistance of the reference resistor is about midway between these limits but a wide range of variation can be tolerated. For example, the resistance of the reference resistance could be ±50% of the midpoint between these limits.

The gain of the transistors in the differential amplifiers depends on the sizes of the transistors in these amplifiers. In one embodiment of the circuit of FIG. 2, transistors 212, 214, 216, 218 are all the same size and PMOS transistors 312, 314 are twice the size of NMOS transistors 316, 318. Other size transistors can be used to adjust the gain of the amplifiers. The use of multiple stages of differential amplifiers having gains that can readily be adjusted makes it possible to compensate for substantial variations in the circuit fabrication process, operating voltage and operating temperature of the circuit of the present invention.

As will be apparent to those skilled in the art numerous variations may be made within the spirit and scope of the present invention.

What is claimed is:

1. A fuse sensing circuit comprising:
   a first amplifier circuit having first and second inputs and first and second outputs;
   a fuse connected between a first node and the first input of the first amplifier circuit;
   a reference resistor connected between the first node and the second input of the first amplifier circuit;
   a second amplifier circuit, which is a differential amplifier, having first and second inputs, the first and second outputs of the first amplifier circuit being connected to the first and second inputs of the second amplifier circuit, the second amplifier circuit comprising first and second PMOS transistors and first and second NMOS transistors, each transistor having a source, a drain and a gate, the first PMOS transistor and first NMOS transistor being connected in series between a second node and ground and the second PMOS transistor and the second NMOS transistor being connected in series between the second node and ground;
   a switch for connecting the second node to a power supply;
   whereby the first amplifier circuit generates an output signal on its first and second outputs indicative of whether the fuse is programmed or not and the second amplifier circuit generates an output signal on a first output indicative of whether the fuse is programmed or not.

2. The fuse sensing circuit of claim 1 further comprising a buffer connected to the first output of the second amplifier circuit.

3. The fuse sensing circuit of claim 1 further comprising a circuit connected to the fuse for programming the fuse.

4. The fuse sensing circuit of claim 3 wherein the programming circuit is an NMOS transistor.

5. The fuse sensing circuit of claim 1 further comprising circuitry for enabling the first and second amplifier circuits.

6. The fuse sensing circuit of claim 1 wherein the first amplifier circuit comprises third and fourth PMOS transistors and first and second NMOS transistors, each transistor having a source, a drain and a gate, the third PMOS transistor and transistor being connected in series between a first voltage supply and ground and the PMOS transistor and the NMOS transistor being connected in series between the first voltage supply and ground.

7. The fuse sensing circuit of claim 6 wherein the first input to the first amplifier circuit is connected to the gates of the PMOS transistor and the NMOS transistor and to a node between the second PMOS transistor and the NMOS transistor and the second input to the first amplifier circuit is connected to the gates of the PMOS transistor and the NMOS transistor and to a node between the PMOS transistor and the NMOS transistor.

8. The fuse sensing circuit of claim 1 wherein the first input to the second amplifier circuit is connected to the gate of the first PMOS transistor and the second input to the second amplifier circuit is connected to the gate of the second PMOS transistor.

9. The fuse sensing circuit of claim 1 wherein the reference resistor has a resistance between a resistance of the fuse in its unprogrammed state and a resistance of the fuse in its programmed state.

10. A fuse sensing circuit comprising:
    a first amplifier circuit having first and second inputs and first and second outputs;
    a fuse connected between a first node and the first input of the first amplifier circuit;
    a reference resistor connected between the first node and the second input of the first amplifier circuit;
    a second amplifier circuit having first and second inputs the first and second outputs of the first amplifier circuit being connected to the first and second inputs of the second amplifier circuit the second amplifier circuit being a differential amplifier comprising first and second PMOS transistors and first and second NMOS transistors, each transistor having a source, a drain and a gate, the first PMOS transistor and first NMOS transistor being connected in series between a second node and ground and the second PMOS transistor and the second NMOS transistor being connected in series between the second node and ground; and a switch for connecting the second node to a power supply;

whereby the first amplifier circuit generates an output signal on its first and second outputs indicative of whether the fuse is programmed or not and the second amplifier circuit generates an output signal on a first output indicative of whether the fuse is programmed or not.

11. The fuse sensing circuit of claim 10 wherein the first input to the second amplifier circuit is connected to the gate of the first PMOS transistor and the second input to the second amplifier circuit is connected to the gate of the second PMOS transistor.

* * * * *